(12) United States Patent
Fujita et al.

(10) Patent No.: US 12,256,163 B2
(45) Date of Patent: Mar. 18, 2025

(54) IMAGE SENSOR

(71) Applicant: SAMSUNG ELECTRONICS CO., LTD., Suwon-si (KR)

(72) Inventors: Masato Fujita, Suwon-si (KR); Kyungho Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 17/867,391

(22) Filed: Jul. 18, 2022

(65) Prior Publication Data

US 2022/0360730 A1    Nov. 10, 2022

Related U.S. Application Data

(63) Continuation of application No. 16/745,909, filed on Jan. 17, 2020, now Pat. No. 11,412,166.

(30) Foreign Application Priority Data

Apr. 29, 2019    (KR) .................. 10-2019-0050047

(51) Int. Cl.
*H04N 25/76*    (2023.01)
*H01L 27/146*   (2006.01)
*H04N 25/75*    (2023.01)

(52) U.S. Cl.
CPC ......... *H04N 25/76* (2023.01); *H01L 27/1461* (2013.01); *H01L 27/14614* (2013.01); *H01L 27/1463* (2013.01); *H04N 25/75* (2023.01)

(58) Field of Classification Search
CPC ........... H01L 27/1463; H01L 27/14614; H01L 27/1461; H01L 27/14689; H01L 27/14641
See application file for complete search history.

(56) References Cited

U.S. PATENT DOCUMENTS

| | | |
|---|---|---|
| 7,745,860 B2 | 6/2010 | Inoue et al. |
| 8,946,794 B2 | 2/2015 | Ahn |
| 9,659,987 B2 | 5/2017 | Wang et al. |
| 9,978,785 B2 | 5/2018 | Kwag et al. |
| 9,997,556 B2 | 6/2018 | Hwang |
| 10,121,806 B2 | 11/2018 | Milic-Strkalj |

(Continued)

FOREIGN PATENT DOCUMENTS

| | | |
|---|---|---|
| KR | 20070102602 | 10/2007 |
| KR | 20160034225 | 3/2016 |

(Continued)

*Primary Examiner* — Tony Ko
(74) *Attorney, Agent, or Firm* — Fish & Richardson P.C.

(57) ABSTRACT

An image sensor includes a semiconductor substrate having a first surface and a second surface opposite to the first surface, a transfer gate electrode provided on the first surface of the semiconductor substrate, readout circuit transistors spaced apart from the transfer gate electrode and provided on the first surface of the semiconductor substrate, and a photoelectric conversion layer provided in the semiconductor substrate at a side of the transfer gate electrode and including dopants of a first conductivity type. The photoelectric conversion layer includes a first region having a first thickness and a second region having a second thickness that is less than the first thickness. The second region overlaps with at least a portion of the readout circuit transistors in a direction perpendicular to the first surface of the semiconductor substrate.

20 Claims, 18 Drawing Sheets

(56) References Cited

U.S. PATENT DOCUMENTS

| | | |
|---|---|---|
| 10,157,948 B2 | 12/2018 | Lee et al. |
| 10,468,449 B2 | 11/2019 | Lee |
| 2016/0020237 A1 | 1/2016 | Yamakawa |
| 2017/0148833 A1 | 5/2017 | Kido et al. |
| 2020/0176500 A1* | 6/2020 | Sze .................. H01L 27/14614 |

FOREIGN PATENT DOCUMENTS

| | | |
|---|---|---|
| KR | 20170019012 | 2/2017 |
| KR | 20180051130 | 5/2018 |

\* cited by examiner

IMAGE SENSOR

CROSS-REFERENCE TO RELATED APPLICATION

This is a Continuation of U.S. application Ser. No. 16/745,909, filed Jan. 17, 2020, and a claim of priority under 35 U.S.C. § 119 is made to Korean Patent Application No. 10-2019-0050047, filed on Apr. 29, 2019, in the Korean Intellectual Property Office, the entire contents of which are hereby incorporated by reference.

BACKGROUND

The inventive concepts herein relate to image sensors, and more particularly to image sensors having improved electrical and optical characteristics.

Image sensors convert optical images into electrical signals. As both computer and communication industries have developed, high-performance image sensors have been increasingly demanded for use in for example digital cameras, camcorders, personal communication systems (PCS), game consoles, security cameras, and medical micro cameras, as well in various other devices and fields.

Image sensors may be categorized as charge coupled device (CCD) image sensors and complementary metal-oxide-semiconductor (CMOS) image sensors. CMOS image sensors typically may be simply driven. In addition, a CMOS image sensor may be realized as a single chip on which a signal processing circuit and an image sensing part are integrated. Thus, CMOS image sensors may have reduced size. Moreover, CMOS image sensors may have very low power consumption, and may thus be suitable for use in products having limited battery capacity. Furthermore, CMOS image sensors may be manufactured using CMOS processing techniques, thereby reducing manufacturing cost. Also, CMOS image sensors may have high resolution as a result of the development of the aforementioned CMOS processing techniques. Accordingly, CMOS image sensors are widely used in various fields.

SUMMARY

Embodiments of the inventive concepts provide an image sensor with improved electrical and optical characteristics.

Embodiments of the inventive concepts provide an image sensor including a semiconductor substrate having a first surface and a second surface opposite to the first surface; a transfer gate electrode provided on the first surface of the semiconductor substrate; readout circuit transistors spaced apart from the transfer gate electrode and provided on the first surface of the semiconductor substrate; and a photoelectric conversion layer provided in the semiconductor substrate at a side of the transfer gate electrode and including dopants of a first conductivity type. The photoelectric conversion layer includes a first region having a first thickness and a second region having a second thickness that is less than the first thickness. The second region overlaps with at least a portion of the readout circuit transistors in a direction perpendicular to the first surface of the semiconductor substrate.

Embodiments of the inventive concepts further provide an image sensor including a semiconductor substrate having a first conductivity type, and having a first surface and a second surface opposite to the first surface; a pixel isolation layer disposed adjacent to the second surface in the semiconductor substrate, and defining a photoelectric conversion region and a readout circuit region disposed at a side of the photoelectric conversion region; a transfer gate electrode disposed on the first surface of the semiconductor substrate in the photoelectric conversion region; readout circuit transistors disposed on the first surface of the semiconductor substrate in the readout circuit region; and a photoelectric conversion layer provided in the semiconductor substrate between the transfer gate electrode and the readout circuit transistors, and including dopants of a second conductivity type that is different than the first conductivity type. The photoelectric conversion layer includes a first region having a first thickness and a second region having a second thickness that is less than the first thickness. The second region overlaps with at least a portion of the readout circuit transistors in a direction perpendicular to the first surface of the semiconductor substrate.

Embodiments of the inventive concepts still further provide an image sensor including a semiconductor substrate having a first surface and a second surface opposite to the first surface; a transfer gate electrode provided on the first surface of the semiconductor substrate; readout circuit transistors provided on the first surface of the semiconductor substrate and spaced apart from a first side surface of the transfer gate electrode; a photoelectric conversion layer including dopants of a first conductivity type and provided in the semiconductor substrate between the transfer gate electrode and the readout circuit transistors; and a floating diffusion region including dopants of the first conductivity type and provided in the semiconductor substrate at another side of the transfer gate electrode. The photoelectric conversion layer includes a first region having a first thickness, a second region having a second thickness that is less than the first thickness, and a third region having a third thickness that is less than the first thickness. The third region extends from the first region and overlaps with at least a portion of the floating diffusion region in a direction perpendicular to the first surface of the semiconductor substrate.

BRIEF DESCRIPTION OF THE DRAWINGS

The inventive concepts will become more apparent in view of the attached drawings and accompanying detailed description.

DETAILED DESCRIPTION OF THE EMBODIMENTS

An image sensor and a method of manufacturing the same according to embodiments of the inventive concepts will be described more fully hereinafter with reference to the accompanying drawings.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
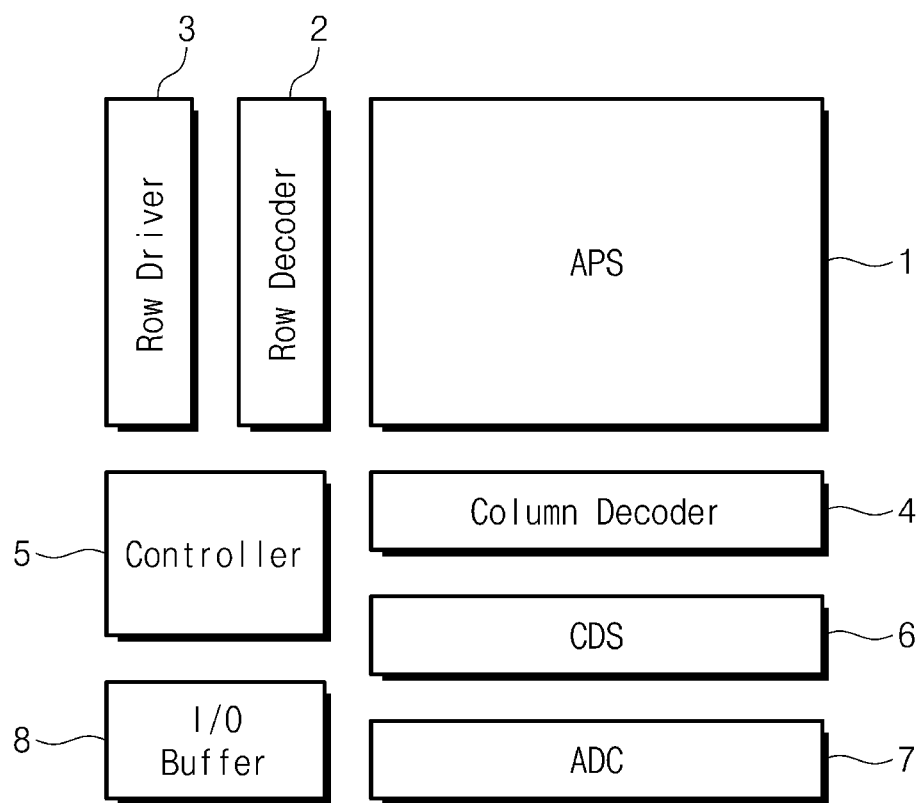
FIG. 1 illustrates a schematic block diagram of an image sensor according to embodiments of the inventive concepts.

FIG. 1 illustrates a schematic block diagram of an image sensor according to embodiments of the inventive concepts.

Referring to FIG. 1, an image sensor may include for example an active pixel sensor array 1, a row decoder 2, a row driver 3, a column decoder 4, a controller 5 (e.g., a timing generator), a correlated double sampler (CDS) 6, an analog-to-digital converter (ADC) 7, and an input/output (I/O) buffer 8.

The active pixel sensor array 1 may include a plurality of unit pixels two-dimensionally arranged and may convert optical signals into electrical signals. The active pixel sensor array 1 may be driven by a plurality of driving signals (e.g., a pixel selection signal, a reset signal, and a charge transfer signal) provided from the row driver 3. In addition, the converted electrical signals may be provided to the correlated double sampler 6.

The row driver 3 may provide a plurality of the driving signals for driving the plurality of unit pixels to the active pixel sensor array 1 in response to signals decoded in the row decoder 2. When the unit pixels are arranged in a matrix form, the driving signals may be provided to each row of the matrix.

The controller 5 (e.g., the timing generator) may provide timing signals and control signals to the row decoder 2 and the column decoder 4.

The correlated double sampler 6 may receive electrical signals generated from the active pixel sensor array 1 and may hold and sample the received electrical signals. The correlated double sampler 6 may doubly sample a specific noise level and a signal level of the electrical signal and may output a difference level corresponding to a difference between the noise level and the signal level.

The analog-to-digital converter 7 may convert an analog signal, which corresponds to the difference level outputted from the correlated double sampler 6, into a digital signal. The analog-to-digital converter 7 may output the digital signal.

The I/O buffer 8 may latch the digital signals and may sequentially output the latched digital signals to an image signal processor (not shown) in response to signals decoded in the column decoder 4.

Figure 2:
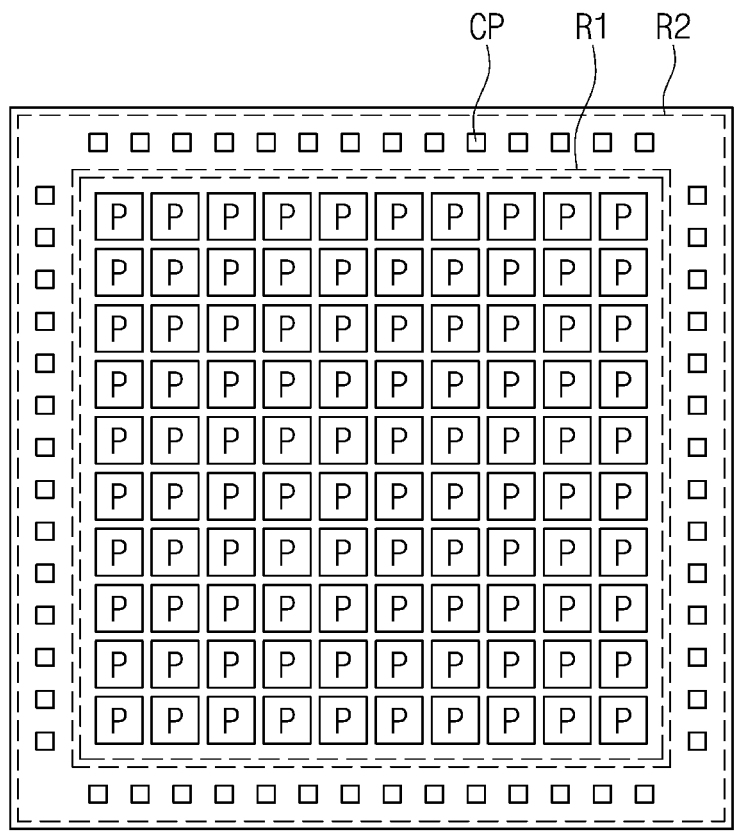
FIG. 2 illustrates a schematic plan view of an image sensor according to embodiments of the inventive concepts.

FIG. 2 illustrates a plan view of an image sensor according to embodiments of the inventive concepts.

Referring to FIG. 2, an image sensor may include a pixel sensor array region R1 and a pad region R2.

A plurality of unit pixels P may be two-dimensionally arranged in first and second directions D1 and D2 intersecting each other in the pixel sensor array region R1. For example, in some embodiments the first direction D1 may extend perpendicularly with respect to the second direction D2. An electrical signal generated by incident light may be output from each of the unit pixels P of the pixel sensor array region R1.

A plurality of conductive pads CP used to input/output control signals and photoelectric signals may be disposed in the pad region R2. The pad region R2 may surround the pixel sensor array region R1 in a plan view, and thus the pad region R2 may be easily connected to external devices.

Figure 3:
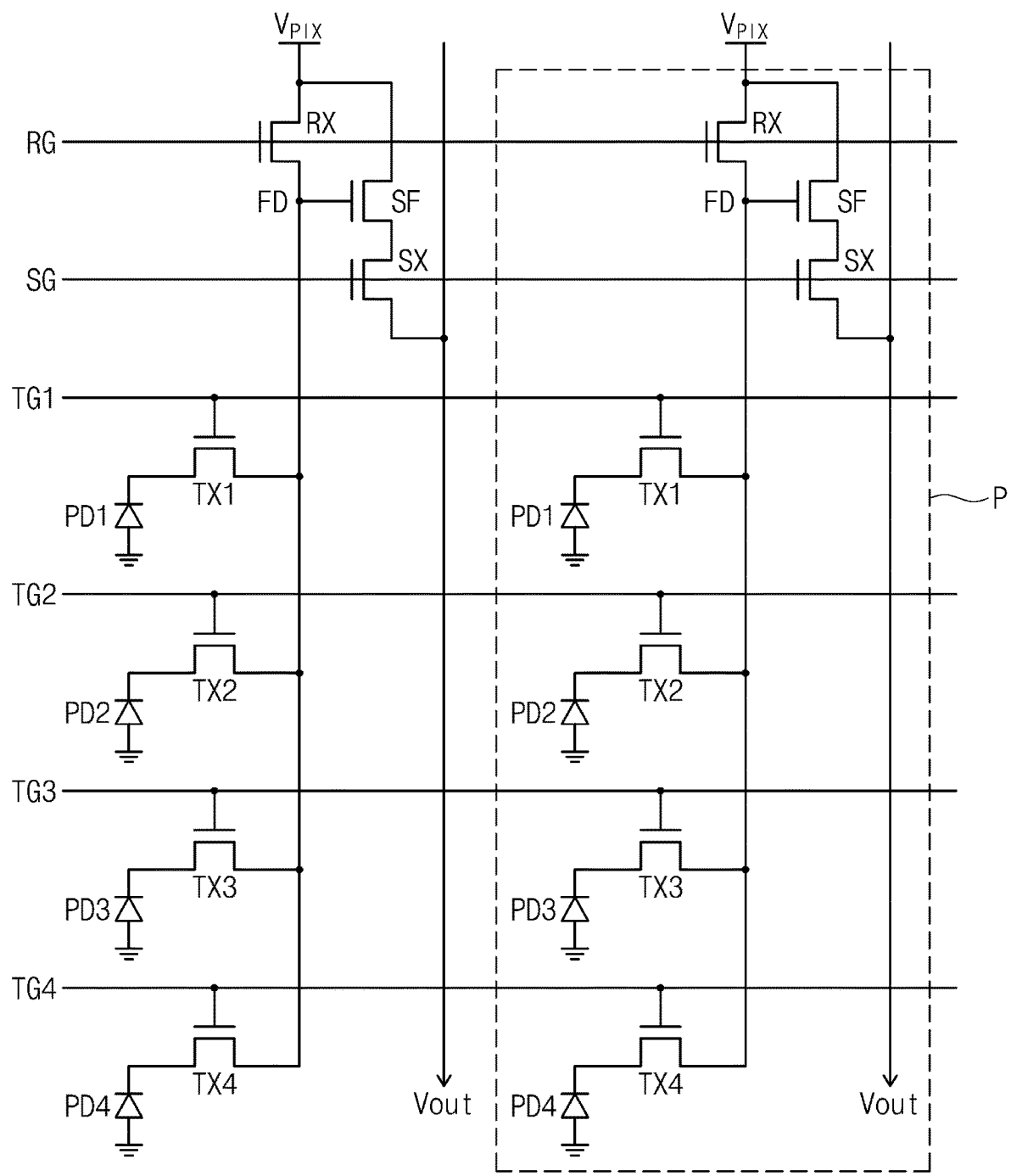
FIG. 3 illustrates a circuit diagram of a unit pixel of an image sensor according to embodiments of the inventive concepts.

FIG. 3 illustrates a circuit diagram of a unit pixel of an image sensor according to embodiments of the inventive concepts.

Referring to FIG. 3, an active pixel sensor array 1 may include a plurality of unit pixels P. The unit pixels P may be arranged along rows and columns.

Each of the unit pixels P may include four photoelectric conversion elements PD1, PD2, PD3 and PD4 and four transfer transistors TX1, TX2, TX3 and TX4. The four transfer transistors TX1, TX2, TX3 and TX4 may share a charge detection node FD and a readout circuit Here, the readout circuit may include a reset transistor RX, a selection transistor SX, and a source follower transistor SF. In the present embodiment, each of the unit pixels P includes the four photoelectric conversion elements PD1, PD2, PD3 and PD4 and the four transfer transistors TX1, TX2, TX3 and TX4. However, embodiments of the inventive concepts are not limited thereto. In certain embodiments, each of the unit pixels P may for example include two photoelectric conversion elements and two transfer transistors.

First to fourth photoelectric conversion elements PD1, PD2, PD3 and PD4 may generate and accumulate photocharges in proportion to the amount of light incident from the outside. Each of the first to fourth photoelectric conversion elements PD1, PD2, PD3 and PD4 may include for example a photodiode, a photo transistor, a photo gate, a pinned photodiode (PPD), or any combination thereof.

First to fourth transfer transistors TX1, TX2, TX3 and TX4 may transfer charges accumulated in the first to fourth photoelectric conversion elements PD1, PD2, PD3 and PD4 to the charge detection node FD. The first to fourth transfer transistors TX1, TX2, TX3 and TX4 may be controlled by charge transfer signals provided through first to fourth charge transfer lines TG1, TG2, TG3 and TG4. Depending on the charge transfer signals applied to the first to fourth transfer transistors TX1 to TX4, charges may be transferred from one of the first to fourth photoelectric conversion elements PD1 to PD4 to the charge detection node FD.

The charge detection node FD may receive the charges generated in each of the first to fourth photoelectric conversion elements PD1, PD2, PD3 and PD4 and may cumulatively store the received charges. The source follower transistor SF may be controlled according to the amount of the photocharges accumulated in the charge detection node FD.

The reset transistor RX may periodically reset the charges accumulated in the charge detection node FD responsive to a reset signal provided through reset line RG. In detail, a drain electrode of the reset transistor RX may be connected to the charge detection node FD, a source electrode of the reset transistor RX may be connected to a pixel power voltage $V_{PIX}$ and a gate electrode of the reset transistor RX may be connected to the reset line RG. When the reset transistor RX is turned on a reset signal, the pixel power voltage $V_{PIX}$ connected to the source electrode of the reset transistor RX may be transmitted to the charge detection node FD. Thus, the charges accumulated in the charge detection node FD may be discharged to reset the charge detection node FD when the reset transistor RX is turned on.

The source follower transistor SF may be a source follower buffer amplifier that generates a source-drain current in proportion to the amount of the photocharges provided to a gate electrode thereof. The source follower transistor SF may amplify a change in potential of the charge detection node FD and may output the amplified signal to an output line Vout through the selection transistor SX. A source electrode of the source follower transistor SF may be connected to the pixel power voltage $V_{PIX}$, and a drain electrode of the source follower transistor SF may be connected to a source electrode of the selection transistor SX.

The selection transistor SX may select the unit pixels P to be sensed in the unit of row. When the selection transistor SX is turned on responsive to a selection signal provided through the selection line SG to a gate electrode of the selection transistor SX, an electrical signal output from the drain electrode of the source follower transistor SF may be output to the output line Vout connected to a drain of the selection transistor SX.

Each unit pixel including four photoelectric conversion elements is illustrated as an example in FIG. 3. However, embodiments of the inventive concepts are not limited thereto. In certain embodiments, each of the unit pixels may include for example two or eight photoelectric conversion elements.

Figure 4:
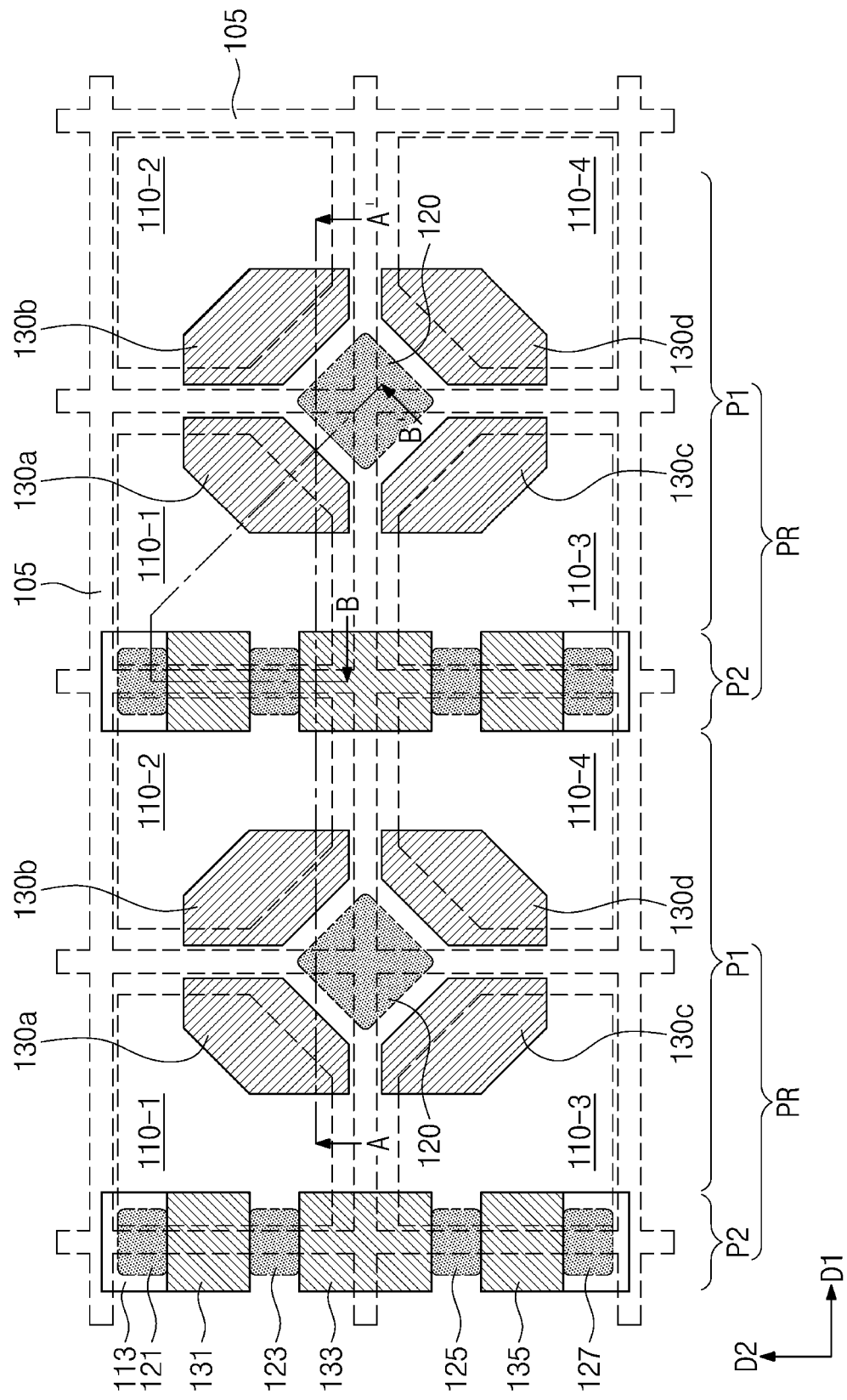
FIG. 4 illustrates a plan view of an image sensor according to embodiments of the inventive concepts.
Figure 5A:
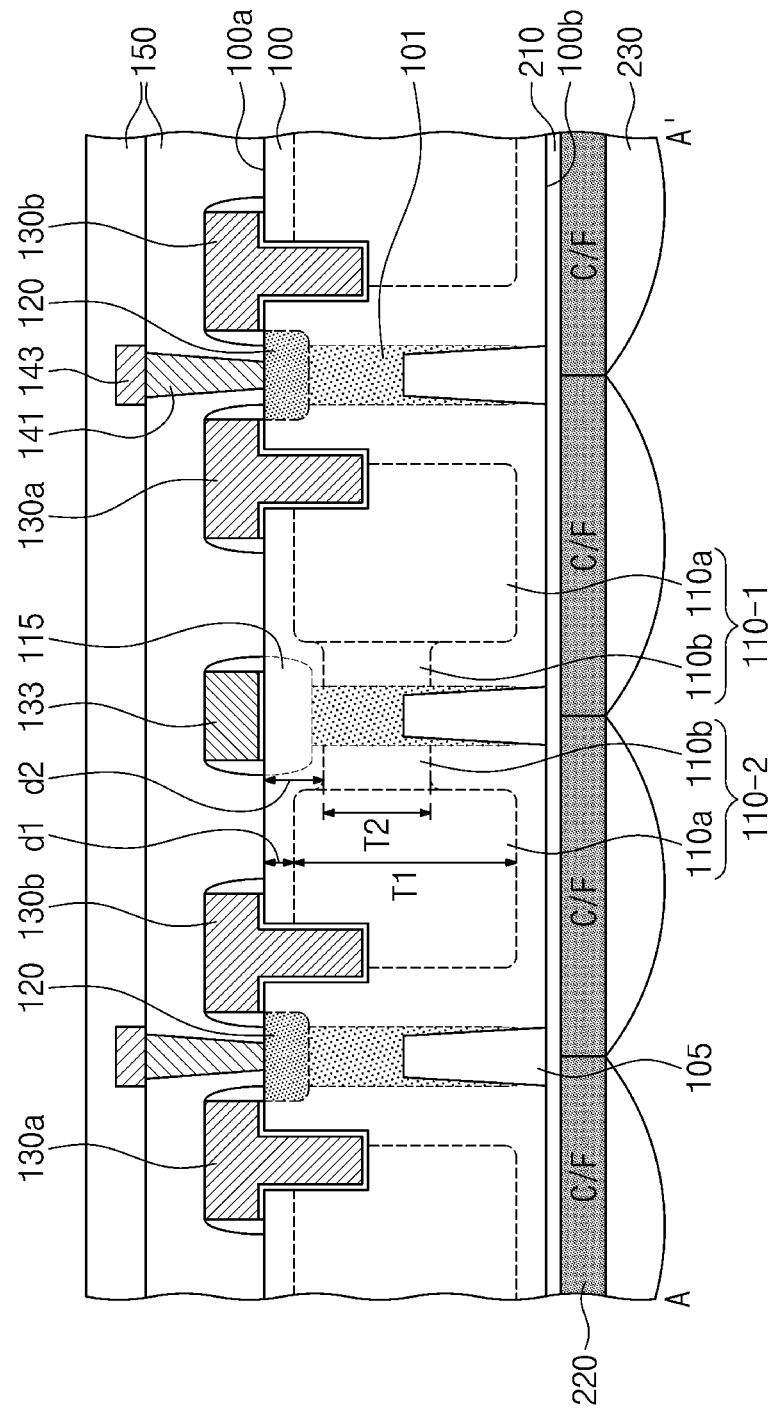
FIGS. 5A and 5B illustrate cross-sectional views taken along lines A-A' and B-B' of FIG. 4, respectively.
Figure 5B:
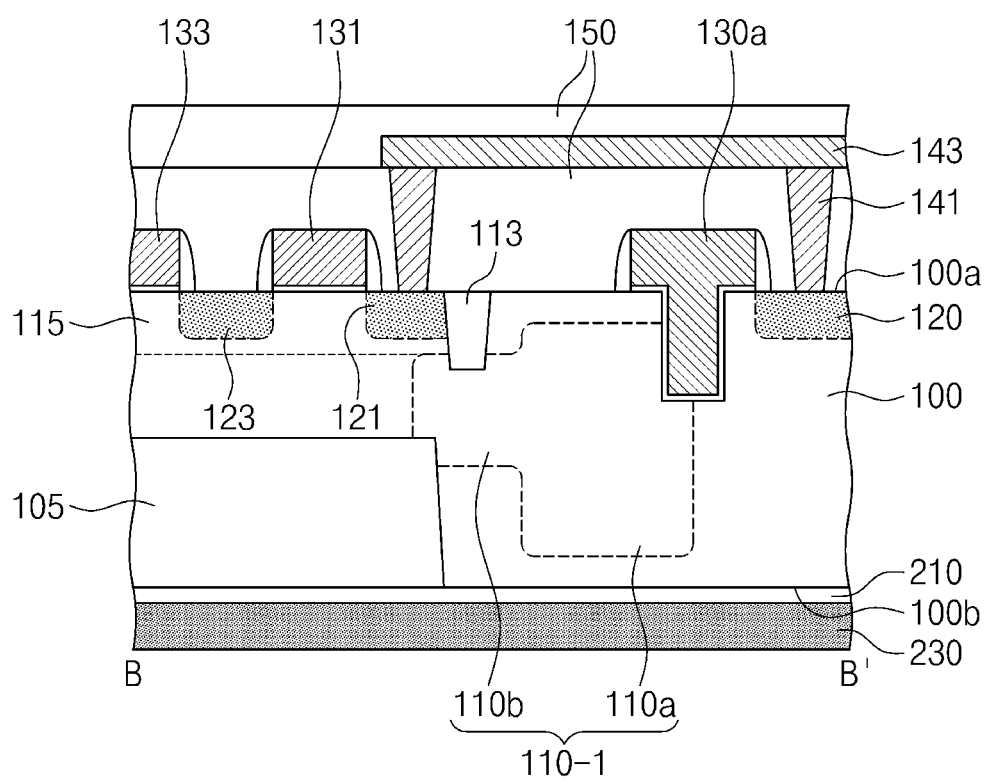

FIG. 4 illustrates a plan view of an image sensor according to embodiments of the inventive concepts. FIGS. 5A and 5B illustrate cross-sectional views respectively taken along lines A-A' and B-B' of FIG. 4.

Referring to FIGS. 4, 5A and 5B, a semiconductor substrate 100 may be a substrate in which an epitaxial layer having a first conductivity type (e.g., a P-type) is formed on a bulk silicon substrate having the first conductivity type. In some embodiments, due to a process of manufacturing an image sensor, the semiconductor substrate 100 may be the P-type epitaxial layer remaining by removing the bulk silicon substrate. In certain embodiments, the semiconductor substrate 100 may be a bulk semiconductor substrate including a well having the first conductivity type. The semiconductor substrate 100 may have a first surface (or a front surface) 100a and a second surface (or a back surface) 100b, which are opposite to each other.

The semiconductor substrate 100 may include a plurality of pixel regions PR defined by a pixel isolation layer 105. The plurality of pixel regions PR may be arranged in a matrix form along a first direction D1 and a second direction D2 intersecting the first direction D1. In some embodiments, the pixel isolation layer 105 may be disposed adjacent to the second surface 100b of the semiconductor substrate 100.

Each of the pixel regions PR may include a photoelectric conversion region P1 and a readout circuit region P2. The photoelectric conversion regions P1 and the readout circuit regions P2 of the pixel regions PR may be alternately arranged in the first direction D1. In other words, the readout circuit region P2 may be provided between the photoelectric conversion regions P1 adjacent to each other.

A floating diffusion region 120 may be disposed in a central portion of the photoelectric conversion region P1. The floating diffusion region 120 may be formed by ion-implanting dopants of a second conductivity type (e.g., an N-type) into the semiconductor substrate 100.

First to fourth transfer gate electrodes 130a, 130b, 130c and 130d may be disposed on the first surface 100a of the semiconductor substrate 100 of the photoelectric conversion region Pb. The first to fourth transfer gate electrodes 130a to 130d may be disposed between the floating diffusion region 120 and first to fourth photoelectric conversion layers 110-1 to 110-4, respectively, when viewed in a plan view. Gate insulating layers may be disposed between the semiconductor substrate 100 and the transfer gate electrodes 130a to 130d, respectively.

Each of the first to fourth transfer gate electrodes 130a to 130d may include a lower portion disposed in a trench formed at the first surface 100a of the semiconductor substrate 100, and an upper portion connected to the lower portion and protruding upward from the first surface 100a of the semiconductor substrate 100. In other words, bottom surfaces of the first to fourth transfer gate electrodes 130a to 130d may be located at a lower level than the first surface 100a of the semiconductor substrate 100. The first to fourth transfer gate electrodes 130a to 130d may form channels in a direction perpendicular to the first surface 100a of the semiconductor substrate 100, thereby increasing a transfer efficiency of photocharges generated in the first to fourth photoelectric conversion layers 110-1 to 110-4.

Readout circuit transistors may be disposed on the first surface 100a of the semiconductor substrate 100 of the readout circuit region P2. The readout circuit transistors may be spaced apart from the first to fourth transfer gate electrodes 130a to 130d in the first direction D1.

The readout circuit transistors may include the source follower transistor SF, the reset transistor RX and the selection transistor SX, described with reference to FIG. 3. A source follower gate electrode 133 may be disposed between a selection gate electrode 135 and a reset gate electrode 131.

The reset gate electrode 131, the source follower gate electrode 133 and the selection gate electrode 135 may be spaced apart from each other on the readout circuit region P2 in the second direction D2 intersecting the first direction D1. A gate insulating layer may be disposed between the first surface 100a of the semiconductor substrate 100 and the reset, source follower and selection gate electrodes 131, 133 and 135.

The reset gate electrode 131, the source follower gate electrode 133 and the selection gate electrode 135 may be disposed on a well dopant layer 115 having the first conductivity type. In certain embodiments, the well dopant layer 115 may be omitted.

A first source/drain region 121 may be formed in the well dopant layer 115 at a side of the reset gate electrode 131, and a second source/drain region 123 may be formed in the well dopant layer 115 at a side of the source follower gate electrode 133. A third source/drain region 125 may be formed in the well dopant layer 115 at a side of the selection gate electrode 135. A fourth source/drain region 127 may be formed in the well dopant layer 115 at another side of the selection gate electrode 135.

The first to fourth source/drain regions 121, 123, 125 and 127 may be formed by ion-implanting dopants having the second conductivity type (e.g., the N-type) into the well dopant layer 115.

As described above, the floating diffusion region 120 may be disposed in the central portion of the photoelectric conversion region P1. The floating diffusion region 120 may have the second conductivity type.

The first to fourth photoelectric conversion layers 110-1 to 110-4 may be provided in the semiconductor substrate 100 of the photoelectric conversion region P1. The first to fourth photoelectric conversion layers 110-1 to 110-4 may be arranged in a matrix form along the first direction D1 and the second direction D2 when viewed in a plan view. The first to fourth photoelectric conversion layers 110-1 to 110-4 may share one floating diffusion region 120.

The first to fourth photoelectric conversion layers 110-1 to 110-4 may be formed by ion-implanting dopants of the second conductivity type (e.g., the N-type) into the semiconductor substrate 100. Photodiodes may be formed by junction of the semiconductor substrate 100 having the first conductivity type and the first to fourth photoelectric conversion layers 110-1 to 110-4 having the second conductivity type.

In some embodiments, each of the first to fourth photoelectric conversion layers 110-1 to 110-4 may include a first region 110a having a first thickness T1, and a second region 110b having a second thickness T2 less than the first thickness T1. The first region 110a of each of the first to fourth photoelectric conversion layers 110-1 to 110-4 may be disposed between each of the transfer gate electrodes 130a to 130d and the readout circuit transistors when viewed in a plan view. The second region 110b of each of the first to fourth photoelectric conversion layers 110-1 to 110-4 may overlap with at least a portion of the readout circuit transistors when viewed in a plan view. That is, in some embodiments as shown in FIG. 5A for example, at least a portion of the readout circuit transistors (e.g., the source follower gate electrode 133 of the source follower transistor SF) is disposed over (e.g., directly above) the second region 110b in a direction perpendicular to the planar surface along which the first surface 100a of the semiconductor substrate 100 extends.

In more detail, the first region 110a of each of the photoelectric conversion layers 110-1 to 110-4 may be spaced apart from the first surface 100a of the semiconductor substrate 100 by a first depth d1, and the second region 110b thereof may be spaced apart from the first surface 100a of the semiconductor substrate 100 by a second depth d2 greater than the first depth d1. Here, the second depth d2 may be greater than a depth of the floating diffusion region 120. The first region 110a of each of the photoelectric conversion layers 110-1 to 110-4 may be laterally spaced apart from the well dopant layer 115 by a predetermined distance and may be laterally spaced apart from the pixel isolation layer 105 by a predetermined distance. Thus, potential barriers may exist between the first regions 110a of the photoelectric conversion layers 110-1 to 110-4 and regions (e.g., channel regions and the source/drain regions 121, 123, 125 and 127) of the readout circuit transistors.

The first region 110a of each of the photoelectric conversion layers 110-1 to 110-4 may be spaced apart from the second surface 100b of the semiconductor substrate 100 by a third depth, and the second region 110b thereof may be spaced apart from the second surface 100b of the semiconductor substrate 100 by a fourth depth greater than the third depth. The bottom surface of each of the transfer gate electrodes 130a to 130d may be located between a top surface and a bottom surface of the first region 110a of each of the photoelectric conversion layers 110-1 to 110-4. The first region 110a of each of the photoelectric conversion layers 110-1 to 110-4 may overlap with a portion of each of the transfer gate electrodes 130a to 130d when viewed in a plan view.

Since the second region 110b of each of the photoelectric conversion layers 110-1 to 110-4 overlaps with a portion of the readout circuit transistors, an area in which photocharges are generated by incident light may be secured even though a size of the image sensor is reduced. Thus, a full well capacity of the image sensor may be increased.

In each of the pixel regions PR, the first to fourth photoelectric conversion layers 110-1 to 110-4 may be isolated from each other by the pixel isolation layer 105 vertically extending from the second surface 100b of the semiconductor substrate 100. An isolation dopant layer 101 and the pixel isolation layer 105 may be disposed between the second regions 110b of the first and second photoelectric conversion layers 110-1 and 110-2 adjacent to each other in the first direction D1.

The pixel isolation layer 105 may surround each of the first to fourth photoelectric conversion layers 110-1 to 110-4 at the second surface 100b of the semiconductor substrate 100. In other words, the pixel isolation layer 105 may be formed between the first and second photoelectric conversion layers 110-1 and 110-2 adjacent to each other in the first direction D1, between the third and fourth photoelectric conversion layers 110-3 and 110-4 adjacent to each other in the first direction D1, between the first and third photoelectric conversion layers 110-1 and 110-3 adjacent to each other in the second direction D2, and between the second and fourth photoelectric conversion layers 110-2 and 110-4 adjacent to each other in the second direction D2.

The pixel isolation layer 105 may vertically extend from the second surface 100b of the semiconductor substrate 100 toward the first surface 100a of the semiconductor substrate 100. A width of a portion of the pixel isolation layer 105 adjacent to the first surface 100a of the semiconductor substrate 100 may be less than a width of another portion of the pixel isolation layer 105 adjacent to the second surface 100b of the semiconductor substrate 100. A width of the pixel isolation layer 105 may become progressively less from the second surface 100b toward the first surface 100a of the semiconductor substrate 100.

In addition, the isolation dopant layer 101 may be disposed between the first to fourth photoelectric conversion layers 110-1 to 110-4 and on the pixel isolation layer 105 in each of the pixel regions PR. The isolation dopant layer 101 may be formed by ion-implanting dopants having the same conductivity type (e.g., the P-type) as the semiconductor substrate 100 into the semiconductor substrate 100. The isolation dopant layer 101 may separately provide incident light into the first to fourth photoelectric conversion layers 110-1 to 110-4 by its potential barrier.

Interlayer insulating layers 150 may be disposed on the first surface 100a of the semiconductor substrate 100 and may cover the first to fourth transfer gate electrodes 130a to 130d and the reset, source follower and selection gate electrodes 131, 133 and 135. A plurality of contact plugs 141 may be disposed in the interlayer insulating layers 150, and interconnection lines 143 may be disposed on the interlayer insulating layers 150 so as to be connected to the contact plugs 141. The interconnection lines 143 may electrically connect the readout circuit transistors and the floating diffusion region 120 of each of the pixel regions PR.

In more detail, the first source/drain region 121 and the source follower gate electrode 133 may be electrically connected to the floating diffusion region 120 through the interconnection line 143. The second source/drain region 123 between the source follower gate electrode 133 and the reset gate electrode 131 may be electrically connected to the pixel power voltage $V_{PIX}$.

The third source/drain region 125 may be the drain electrode of the source follower transistor. The fourth source/drain region 127 may be electrically connected to the output line Vout.

A device isolation layer 113 may be provided in the readout circuit region P2. The device isolation layer 113 may be disposed between the readout circuit regions P2 adjacent to each other and may surround the first and fourth source/drain regions 121 and 127.

A color filter layer 220 and micro lenses 230 may be disposed on the second surface 100b of the semiconductor substrate 100. In addition, a fixed charge layer 210 may be disposed between the second surface 100b of the semiconductor substrate 100 and the color filter layer 220.

The fixed charge layer 210 may include a metal oxide layer containing insufficient oxygen in terms of a stoichiometric ratio or a metal fluoride layer containing insufficient fluorine in terms of a stoichiometric ratio. Thus, the fixed charge layer 210 may have negative fixed charges. The fixed charge layer 210 may include a metal oxide layer or metal fluoride layer including for example at least one of hafnium (Hf), zirconium (Zr), aluminum (Al), tantalum (Ta), titanium (Ti), yttrium (Y), or a lanthanoid. For example, the fixed charge layer 210 may be a hafnium oxide layer or an aluminum fluoride layer. Holes may be accumulated in the vicinity of the fixed charge layer 210. Thus, a dark current and a white spot may be effectively reduced.

Color filters of the color filter layer 220 and the micro lenses 230 may be formed to correspond to the photoelectric conversion layers 110-1 to 110-4, respectively. The color filter layer 220 may include red, green and blue color filters. The color filters may be two-dimensionally arranged. In certain embodiments, the color filters may include a yellow filter, a magenta filter, and a cyan filter. In addition, the color filter layer 220 may further include a white filter.

The micro lens 230 may have a convex shape and may have a specific radius of curvature. The micro lens 230 may be formed of a light-transmitting resin and may concentrate incident light to each of the photoelectric conversion layers 110-1 to 110-4.

Figure 6:
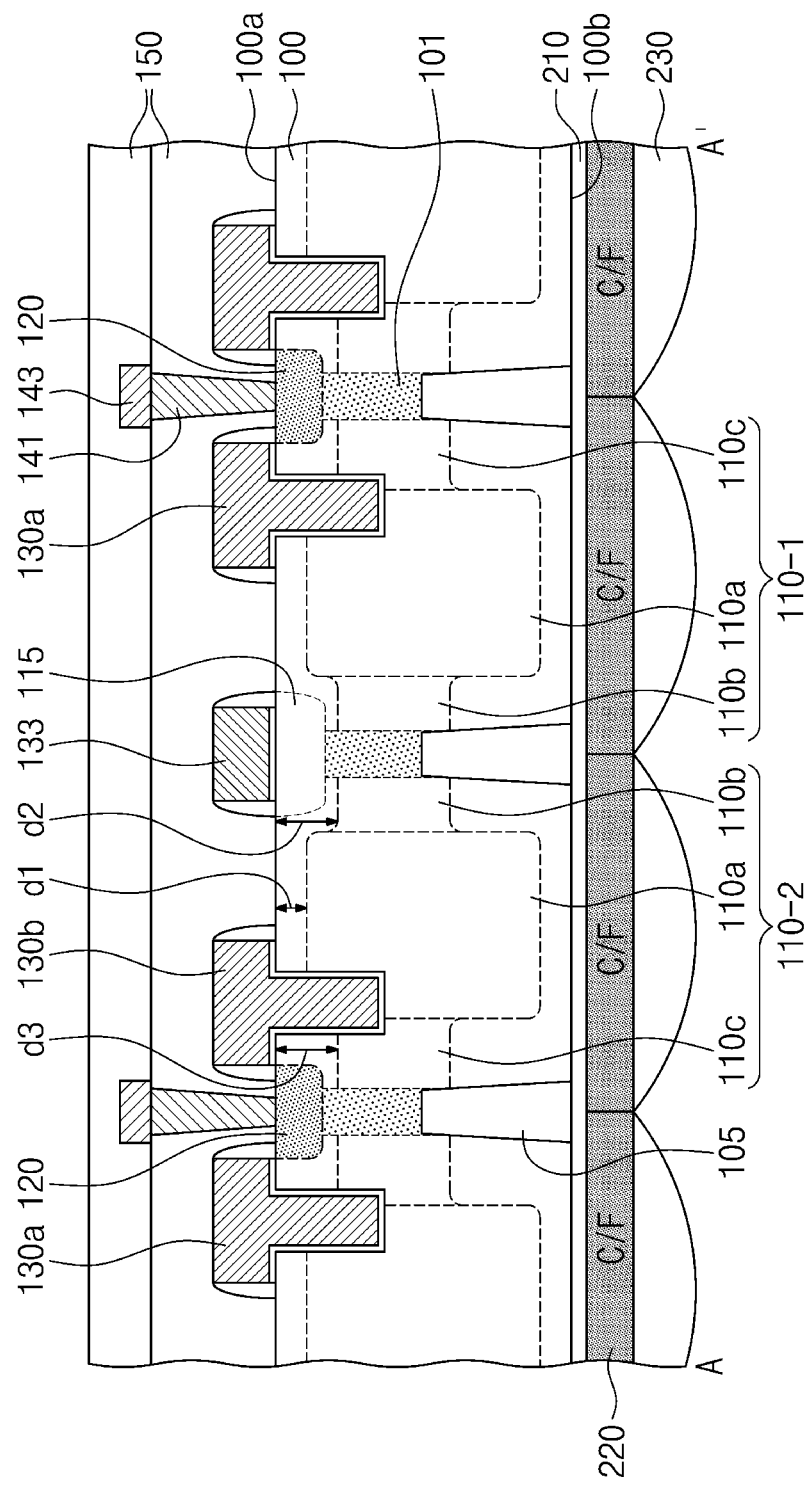
FIG. 6 illustrates a cross-sectional view taken along the line A-A' of FIG. 4 showing an image sensor according to embodiments of the inventive concepts.
Figure 7:
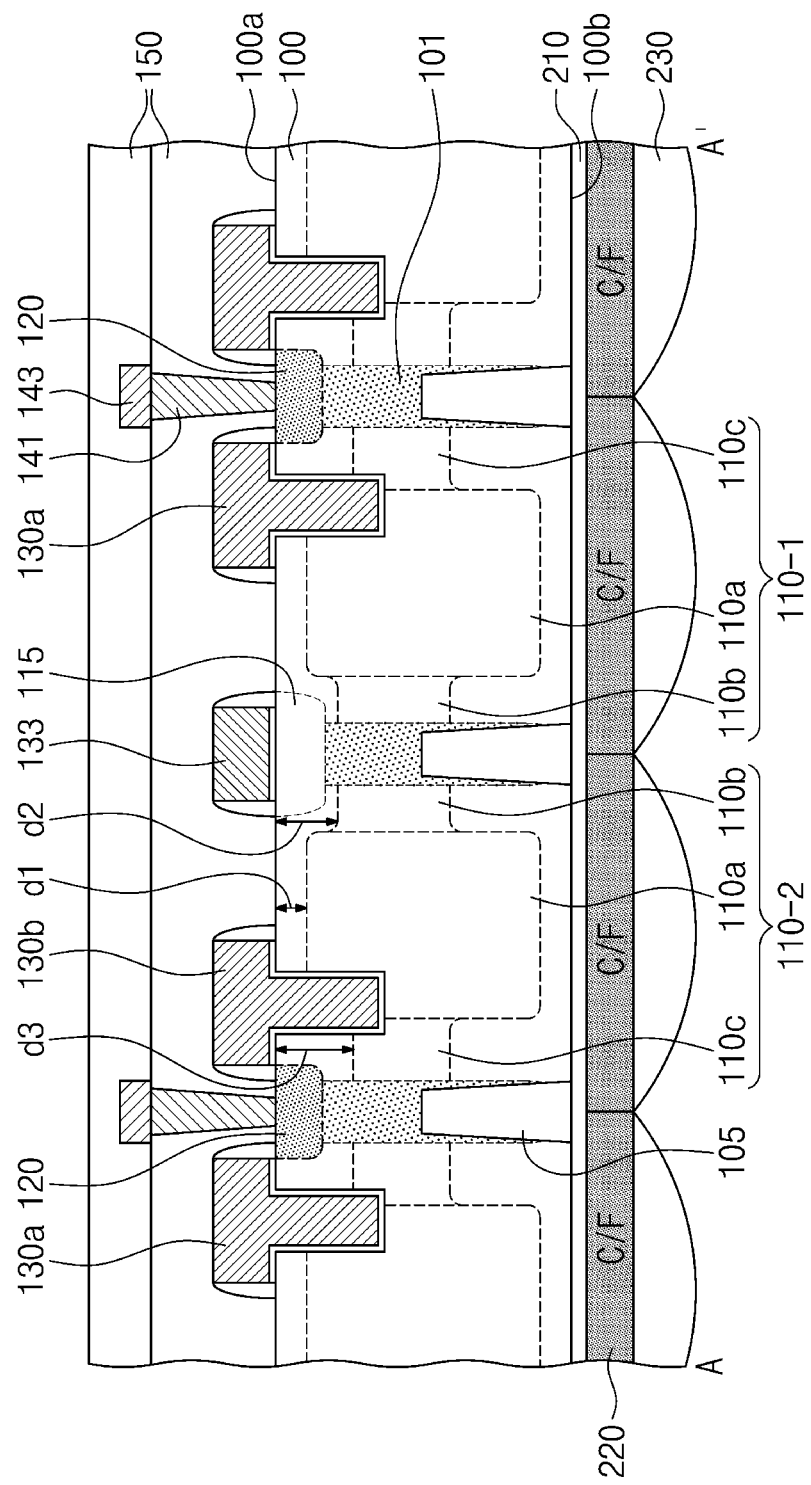
FIG. 7 illustrates a cross-sectional view taken along the line A-A' of FIG. 4 showing another image sensor according to embodiments of the inventive concepts.
Figure 8:
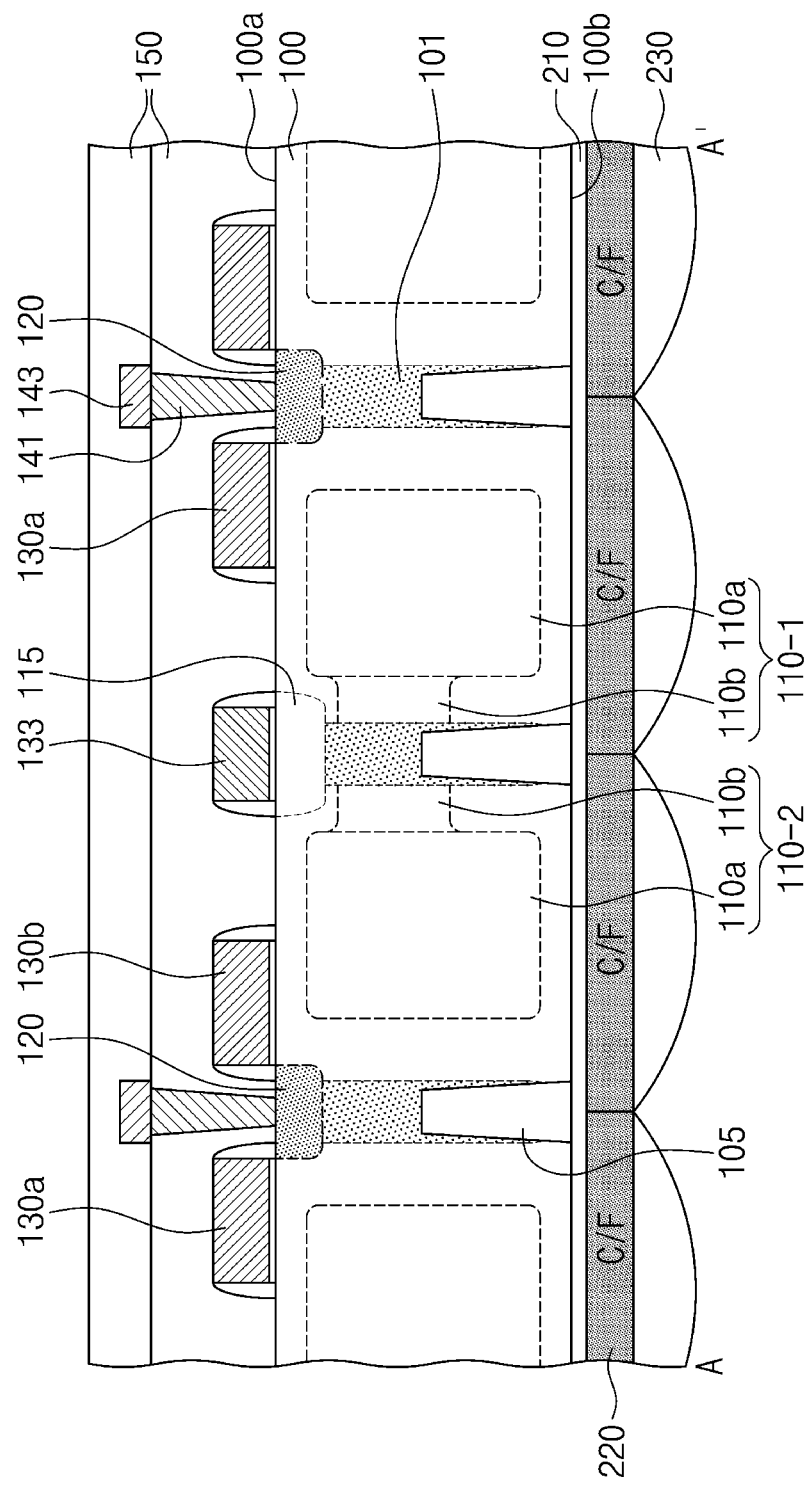
FIG. 8 illustrates a cross-sectional view taken along the line A-A' of FIG. 4 showing a still further image sensor according to embodiments of the inventive concepts.

FIGS. 6, 7 and 8 illustrate cross-sectional views taken along the line A-A' of FIG. 4 to show image sensors according to embodiments of the inventive concepts. Hereinafter, the same components as described above in the embodiments of FIGS. 5A and 5B will be indicated by the same reference numerals or the same reference designators, and the descriptions thereof may be omitted or mentioned briefly for the purpose of ease and convenience in explanation.

Referring to FIGS. 4, 6 and 7, each of first to fourth photoelectric conversion layers 110-1 to 110-4 may include a first region 110a having a first thickness, a second region 110b having a second thickness less than the first thickness, and a third region 110c having a third thickness less than the first thickness. In some embodiments, the third thickness may be substantially equal to the second thickness.

In the present embodiments, the second region 110b of each of the first to fourth photoelectric conversion layers 110-1 to 110-4 may overlap with at least a portion of the readout circuit transistors in a plan view, and the third region 110c of each of the first to fourth photoelectric conversion layers 110-1 to 110-4 may overlap with at least a portion of the floating diffusion region 120 in a plan view. Thus, areas of the first to fourth photoelectric conversion layers 110-1 to 110-4 may be increased to increase photocharge storage capacities (i.e., full well capacities) of the first to fourth photoelectric conversion layers 110-1 to 110-4.

In addition, according to the embodiment of FIG. 6, the first region 110a of each of the photoelectric conversion layers 110-1 to 110-4 may be spaced apart from the first surface 100a of the semiconductor substrate 100 by a first depth d1, and the second region 110b thereof may be spaced apart from the first surface 100a of the semiconductor substrate 100 by a second depth d2 greater than the first depth d1. The third region 110c may be spaced apart from the first surface 100a of the semiconductor substrate 100 by a third depth d3 greater than the first depth d1. Here, the second region 110b and the third region 110c of each of the photoelectric conversion layers 110-1 to 110-4 may be disposed at substantially the same depth from the first surface 100a of the semiconductor substrate 100.

Alternatively, according to the embodiment of FIG. 7, the second region 110b and the third region 110c of each of the photoelectric conversion layers 110-1 to 110-4 may be disposed at different depths from the first surface 100a of the semiconductor substrate 100. For example, the first region 110a of each of the photoelectric conversion layers 110-1 to 110-4 may be spaced apart from the first surface 100a of the semiconductor substrate 100 by a first depth d1, and the second region 110b thereof may be spaced apart from the first surface 100a of the semiconductor substrate 100 by a second depth d2 greater than the first depth d1. The third region 110c of each of the photoelectric conversion layers 110-1 to 110-4 may be spaced apart from the first surface 100a of the semiconductor substrate 100 by a third depth d3 greater than the second depth d2.

Referring to FIGS. 4 and 8, first to fourth transfer gate electrodes 130a to 130d may be disposed on a flat first surface 100a of the semiconductor substrate 100 with gate insulating layers interposed therebetween. In other words, the first to fourth transfer gate electrodes 130a to 130d may have bottom surfaces parallel to the first surface 100a of the semiconductor substrate 100.

Figure 9:
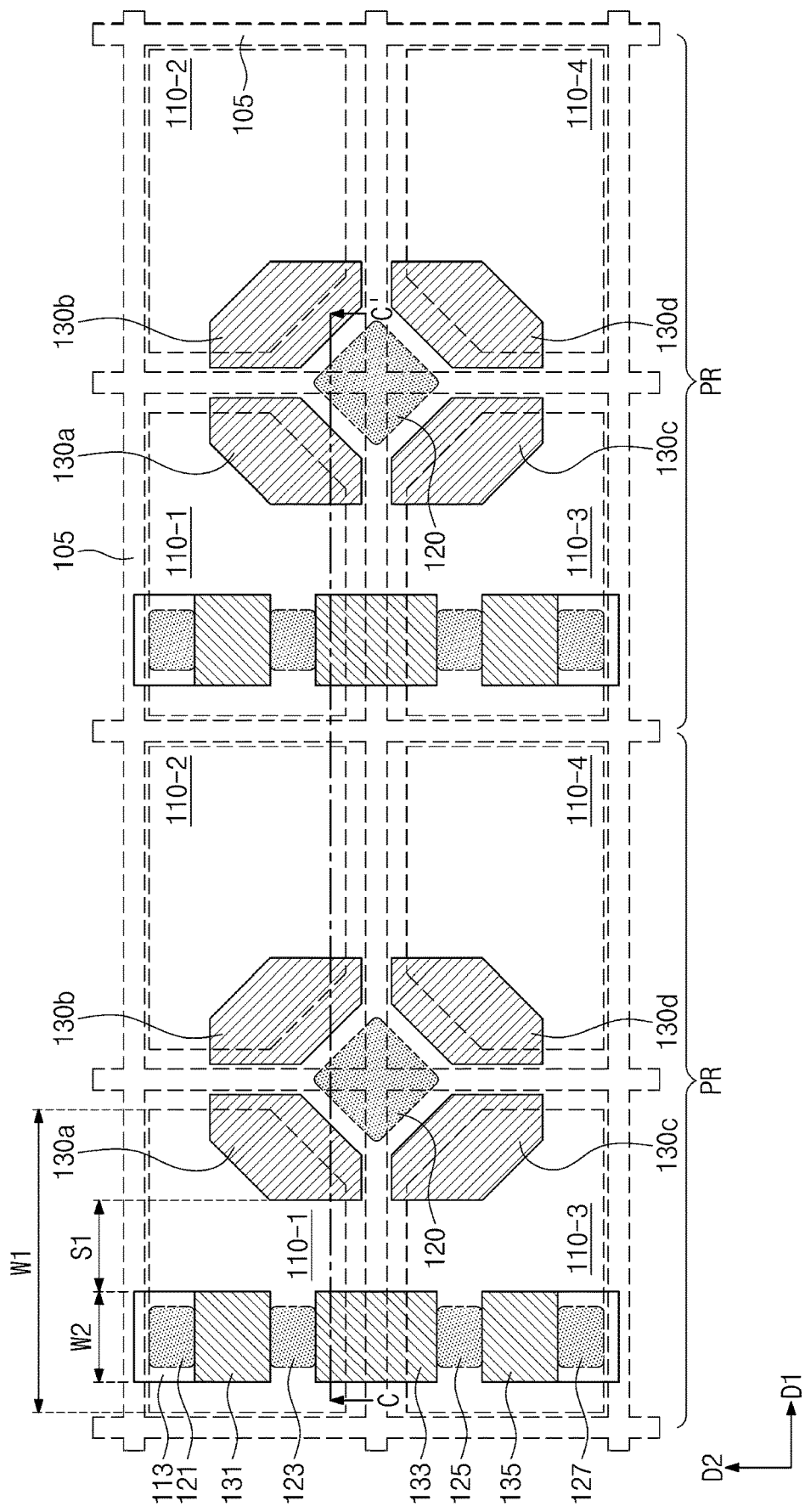
FIG. 9 illustrates a plan view of an image sensor according to embodiments of the inventive concepts.
Figure 10:
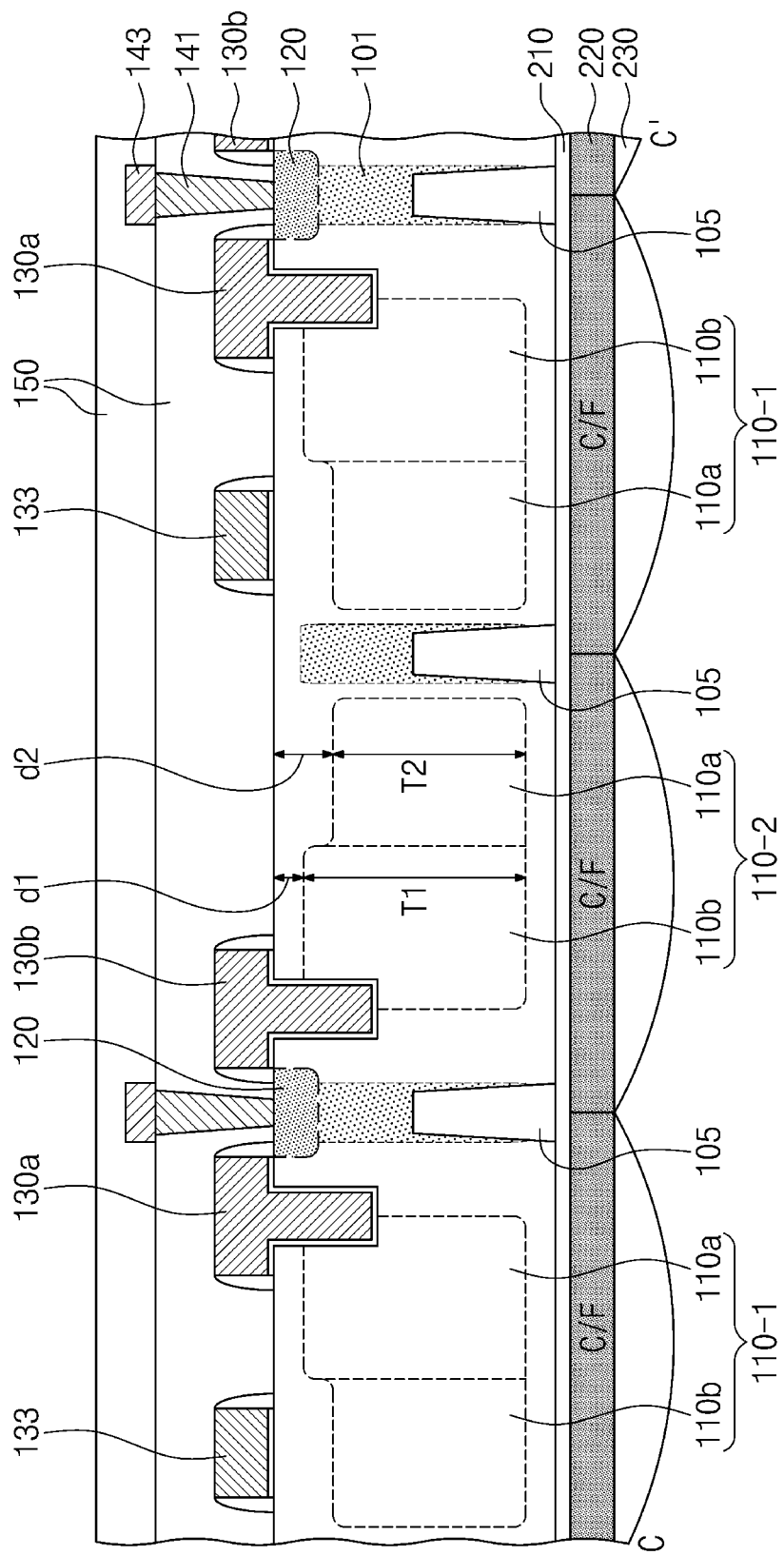
FIG. 10 illustrates a cross-sectional view taken along a line C-C' of FIG. 9 showing an image sensor according to embodiments of the inventive concepts.
Figure 11:
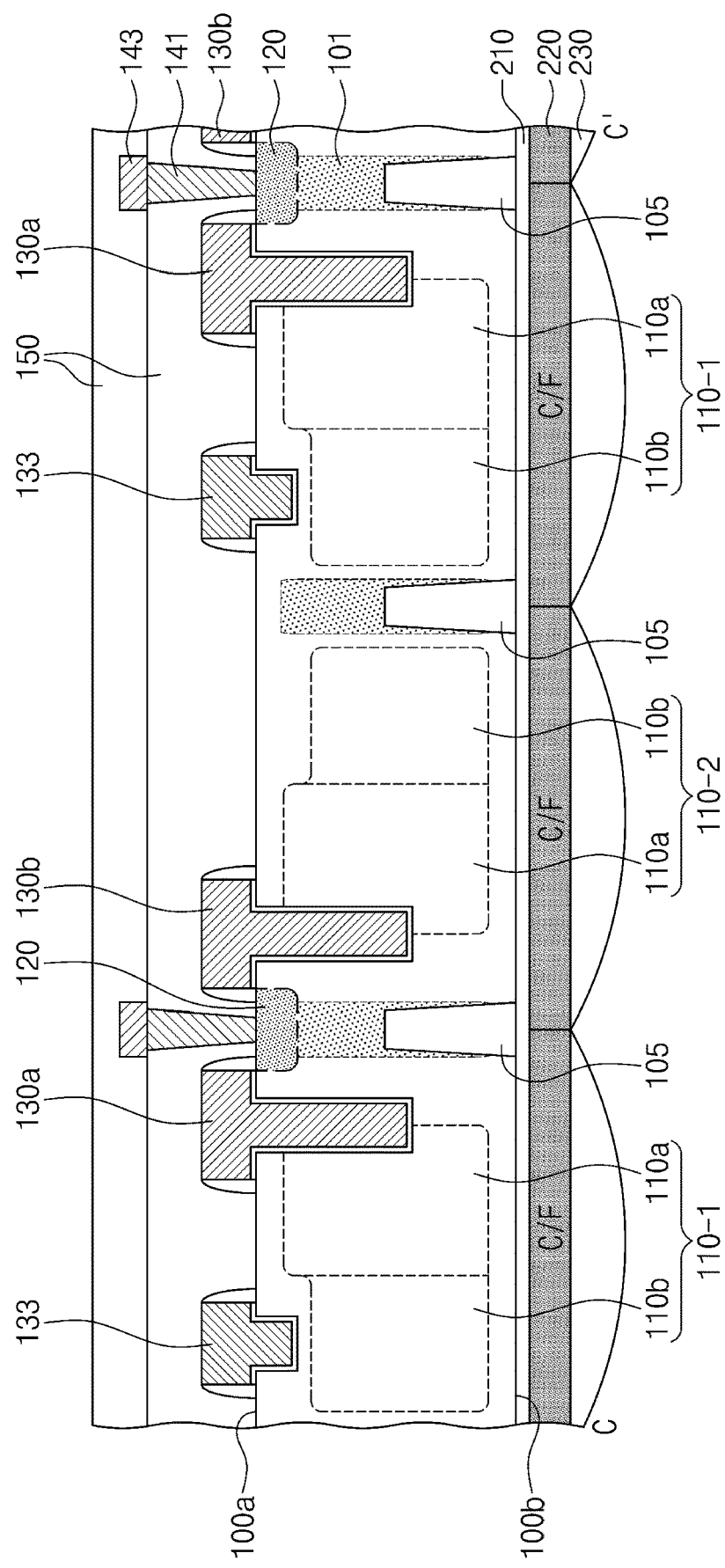
FIG. 11 illustrates a cross-sectional view taken along a line C-C' of FIG. 9 showing another image sensor according to embodiments of the inventive concepts.
Figure 12:
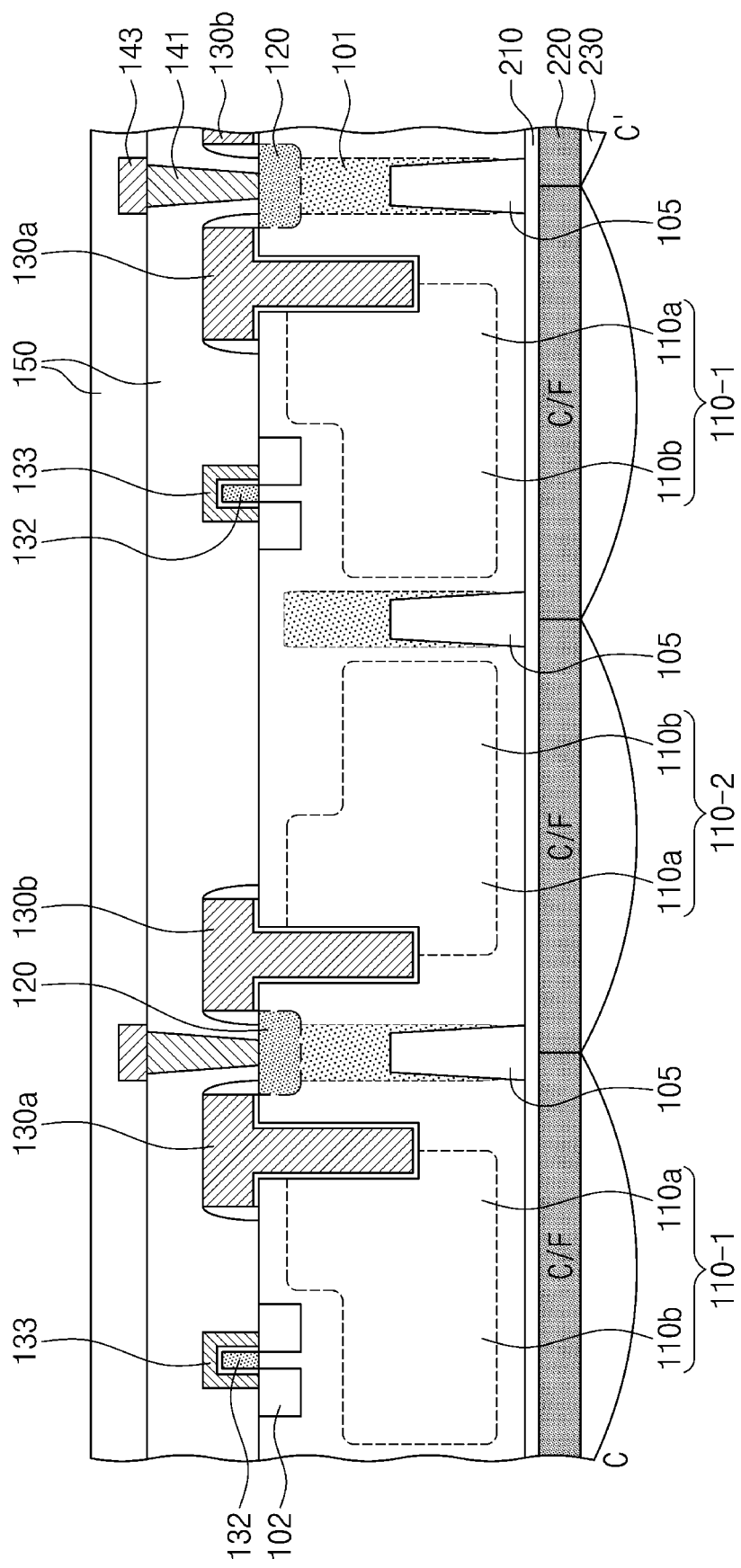
FIG. 12 illustrates a cross-sectional view taken along a line C-C' of FIG. 9 showing a still further image sensor according to embodiments of the inventive concepts.

FIG. 9 illustrates a plan view of an image sensor according to embodiments of the inventive concepts. FIGS. 10 to 12 illustrate cross-sectional views taken along a line C-C' of FIG. 9 to show image sensors according to embodiments of the inventive concepts. Hereinafter, the same components as described above in the embodiments of FIGS. 4, 5A and 5B will be indicated by the same reference numerals or the same reference designators, and the descriptions thereof may be omitted or mentioned briefly for the purpose of ease and convenience in explanation.

Referring to FIGS. 9 and 10, in each of pixel regions PR, readout circuit transistors may completely overlap with at least one of photoelectric conversion layers 110-1 to 110-4 when viewed in a plan view.

In detail, each of first to fourth photoelectric conversion layers 110-1 to 110-4 may have a first width W1 in the first direction D1. The readout circuit transistors may be spaced apart from the first transfer gate electrode 130a in the first direction D1 by a first distance S1. In other words, the source follower gate electrode 133, the reset gate electrode 131 and the selection gate electrode 135 may be spaced apart from the first transfer gate electrode 130a in the first direction D1 by the first distance S1. Each of the source follower, reset and selection gate electrodes 133, 131 and 135 may have a second width W2 in the first direction D1. Here, a sum of the first distance S1 and the second width W2 may be less than the first width W1. In addition, the first distance S1 may be less than the first width W1 of each of the photoelectric conversion layers 110-1 to 110-4. The gate electrodes 131, 133 and 135 of the readout circuit transistors may overlap with the second regions 110b of the first and third photoelectric conversion layers 110-1 and 110-3 when viewed in a plan view.

Referring to FIGS. 9 and 11, a level of bottom surfaces of the first to fourth transfer gate electrodes 130a to 130d may be changed in proportion to a width of the second region 110b of each of the photoelectric conversion layers 110-1 to 110-4. For example, the bottom surfaces of the first to fourth transfer gate electrodes 130a to 130d may be closer to the second surface 100b of the semiconductor substrate 100 than to the first surface 100a of the semiconductor substrate 100. In other words, a distance from the first surface 100a of the semiconductor substrate 100 to the bottom surface of each of the transfer gate electrodes 130a to 130d may be greater than a distance from the second surface 100b of the semiconductor substrate 100 to the bottom surface of each of the transfer gate electrodes 130a to 130d. Thus, distances between the transfer gate electrodes 130a to 130d and the second regions 110b of the photoelectric conversion layers 110-1 to 110-4 may be reduced to improve charge transfer efficiency in operation of the image sensor.

In addition, gate electrodes of the readout circuit transistors may have bottom surfaces located at a lower level than the first surface 100a of the semiconductor substrate 100. In other words, portions of the source follower gate electrode 133, the reset gate electrode 131 and the selection gate electrode 135 may be disposed in recess regions formed in the first surface 100a of the semiconductor substrate 100.

Top surfaces of the second regions 110b of the photoelectric conversion layers 110-1 to 110-4 may be vertically spaced apart from the bottom surfaces of the gate electrodes 131, 133 and 135 of the readout circuit transistors.

Referring to FIGS. 9 and 12, a channel semiconductor pattern 132 may be disposed on the first surface 100a of the semiconductor substrate 100, and a field insulating pattern 102 may be disposed in the semiconductor substrate 100 at both sides of the channel semiconductor pattern 132.

Gate electrodes 131, 133 and 135 of the readout circuit transistors may cover sidewalls and a top surface of the channel semiconductor pattern 132. A gate insulating layer may be disposed between the channel semiconductor pattern 132 and the gate electrodes 131, 133 and 135 of the readout circuit transistors. The channel semiconductor pattern 132 and the gate electrodes 131, 133 and 135 of the readout circuit transistors may overlap with the second regions 110b of the first and third photoelectric conversion layers 110-1 and 110-3 when viewed in a plan view. Top surfaces of the second regions 110b of the photoelectric conversion layers 110-1 to 110-4 may be vertically spaced apart from the field insulating pattern 102.

FIGS. 13, 14, 15, 16 and 17 illustrate cross-sectional views taken along the line A-A' of FIG. 4 showing a method of manufacturing an image sensor, according to embodiments of the inventive concepts.

Figure 13:
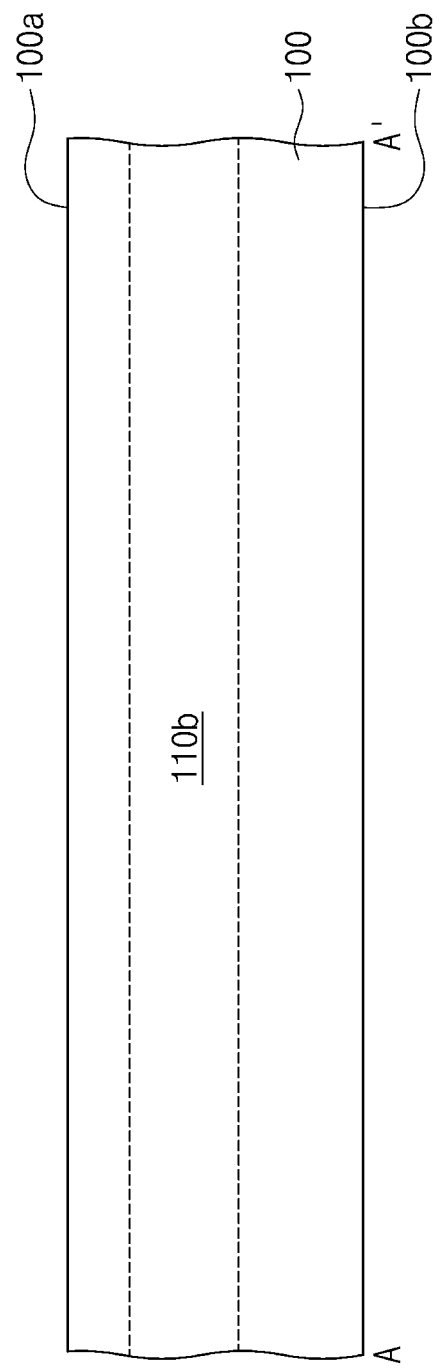
FIGS. 13, 14, 15, 16 and 17 illustrate cross-sectional views taken along line A-A' of FIG. 4, showing a method of manufacturing an image sensor, according to embodiments of the inventive concepts.

Referring to FIGS. 4 and 13, a semiconductor substrate 100 having a first conductivity type (e.g., a P-type) may be provided. The semiconductor substrate 100 may have a first surface 100a and a second surface 100b which are opposite to each other. The semiconductor substrate 100 may be for example a substrate in which an epitaxial layer having the first conductivity type is formed on a bulk silicon substrate having the first conductivity type. Alternatively, the semiconductor substrate 100 may be a bulk semiconductor substrate including a well having the first conductivity type.

Dopants of a second conductivity type (e.g., an N-type) different from the first conductivity type may be injected into the semiconductor substrate 100 of the first conductivity type to form a first dopant layer 110b. The first dopant layer 110b may be formed using an ion implantation process. The first dopant layer 110b may correspond to the second regions of the photoelectric conversion layers described above.

A well dopant layer 115 (not shown in FIG. 13) may be formed in each of pixel regions PR. The well dopant layer 115 may be formed by ion-implanting dopants of the first conductivity type and may be closer to the first surface 100a of the semiconductor substrate 100 than the first dopant layer 110b.

Figure 14:
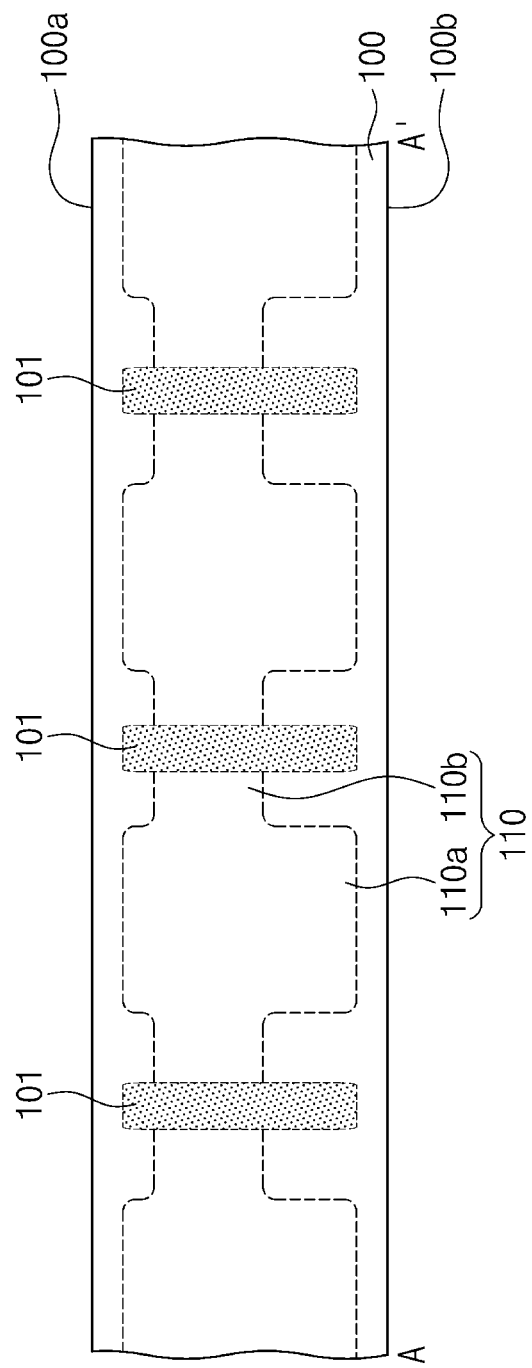

Referring to FIGS. 4 and 14, an isolation dopant layer 101 defining photoelectric conversion regions P1 may be formed, and second dopant layers 110a may be formed in the photoelectric conversion regions P2, respectively.

The isolation dopant layer 101 may be formed by ion-implanting dopants of the first conductivity type (e.g., the P-type) into the semiconductor substrate 100 having the first dopant layer 110b. A concentration of the dopants in the isolation dopant layer 101 may be greater than a concentration of the dopants in the first dopant layer 110b.

The second dopant layers 110a may be formed by ion-implanting dopants of the second conductivity type. The second dopant layers 110a may correspond to the first regions of the photoelectric conversion layers described above.

The formation of the second dopant layers 110a may include forming a mask (not shown) having openings on the first surface 100a of the semiconductor substrate 100, and ion-implanting the dopants of the second conductivity type (e.g., the N-type) different from the first conductivity type into the semiconductor substrate 100 by using the mask as an ion implantation mask.

The second dopant layers 110a may be formed before or after the formation of the isolation dopant layer 101. The second dopant layers 110a may be formed by the ion implantation process as described above, and an ion implantation depth of the second dopant layers 110a may be greater than an ion implantation depth of the first dopant layer 110b. A concentration of the dopants in the second dopant layer 110a may be substantially equal to a concentration of the dopants in the first dopant layer 110b. Since the first and second dopant layers 110b and 110a are formed as described above, photoelectric conversion layers 110 may be formed. In the present embodiments, the first dopant layer 110b may be formed, and then, the second dopant layers 110a may be formed. Alternatively, the second dopant layers 110a may be formed, and then, the first dopant layer 110b may be formed.

Figure 15:
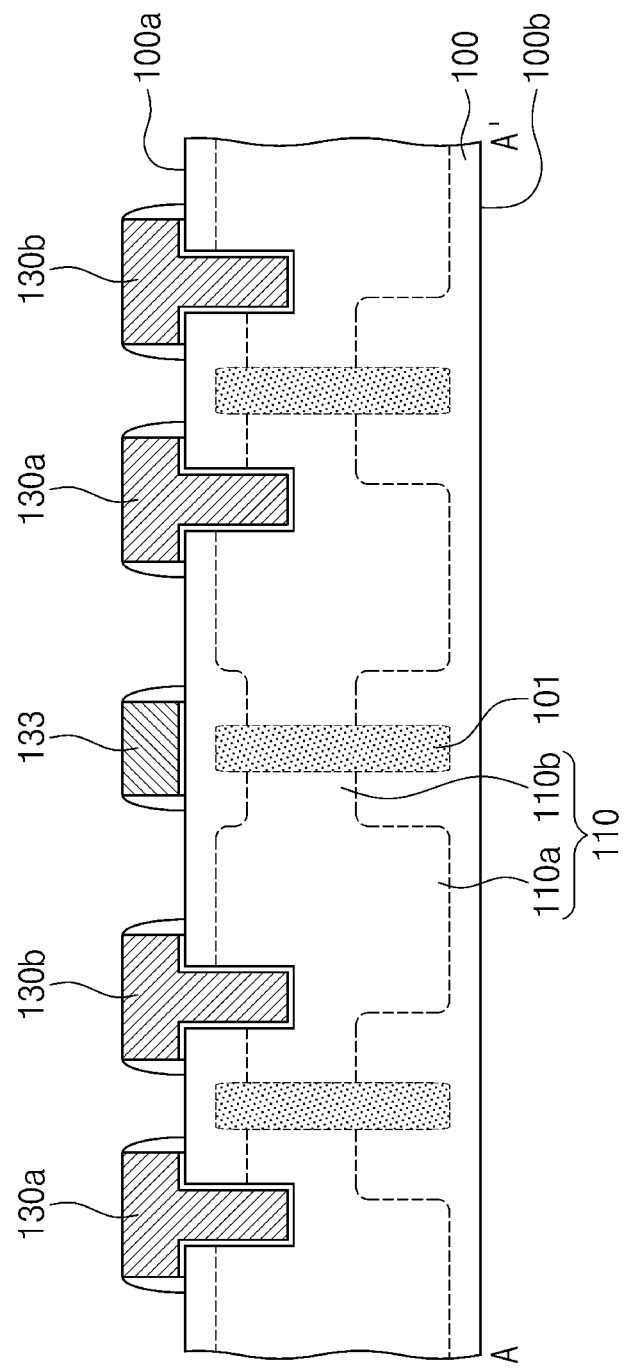

Referring to FIGS. 4 and 15, transfer gate electrodes 130a to 130d and gate electrodes 131, 133 and 135 of readout circuit transistors may be formed on the first surface 100a of the semiconductor substrate 100.

In some embodiments, the formation of the transfer gate electrodes 130a to 130d may include patterning the first surface 100a of the semiconductor substrate 100 to form gate recess regions, forming a gate insulating layer conformally covering inner surfaces of the gate recess regions, forming a gate conductive layer filling the gate recess regions, and patterning the gate conductive layer. In addition, the gate electrodes 131, 133 and 135 of the readout circuit transistors may also be formed during the formation of the transfer gate electrodes 130a to 130d.

Figure 16:
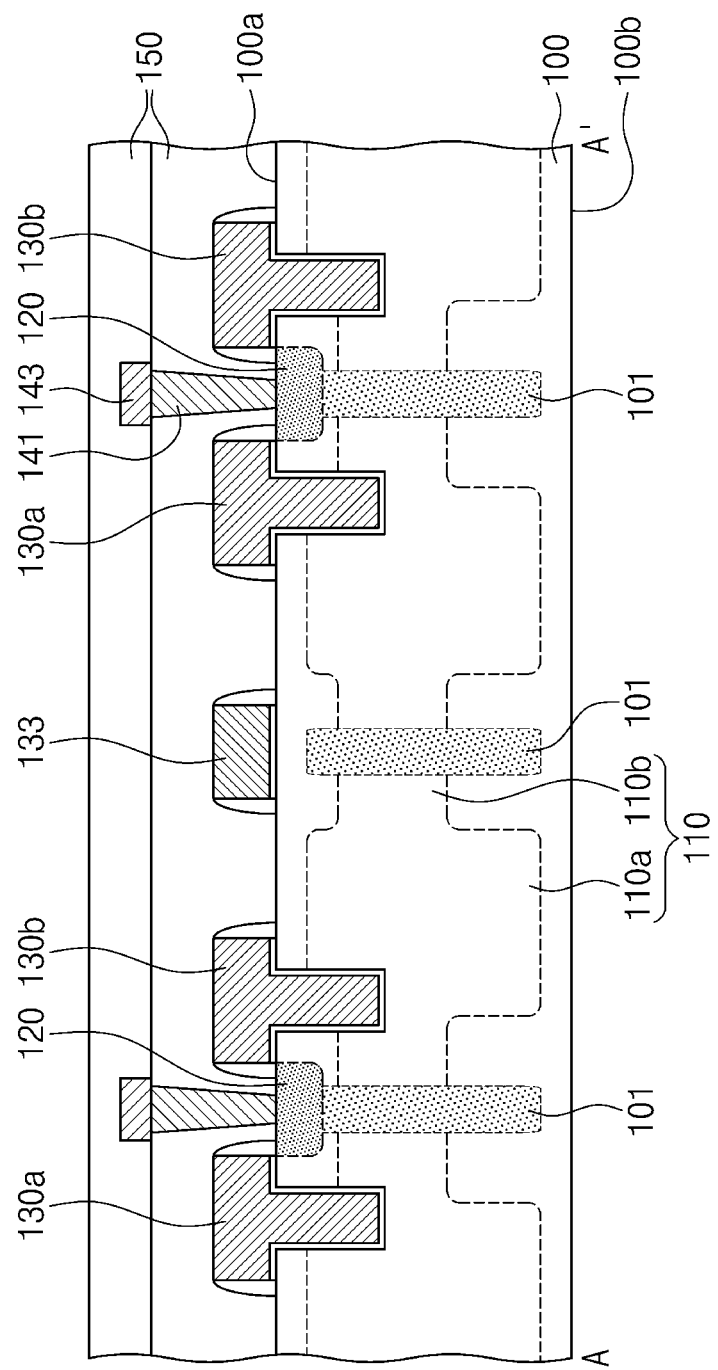

Referring to FIGS. 4 and 16, a floating diffusion region 120 may be formed in the semiconductor substrate 100 between the transfer gate electrodes 130a to 130d. The floating diffusion region 120 may be formed by ion-implanting dopants of the second conductivity type.

In addition, source/drain regions 121, 123, 125 and 127 of the readout circuit transistors may also be formed when the floating diffusion region 120 is formed.

Next, interlayer insulating layers 150 may be formed on the first surface 100a of the semiconductor substrate 100 to cover the transfer gate electrodes 130a to 130d and the gate electrodes 131, 133 and 135 of the readout circuit transistors. The interlayer insulating layers 150 may be formed of a material having excellent gap-fill characteristics and may be formed to have planarized top surfaces. For example, each of the interlayer insulating layers 150 may be formed of high density plasma (HDP) oxide, Tonen silazene (TOSZ), spin on glass (SOG), and/or undoped silica glass (USG).

Contact plugs 141 may penetrate the interlayer insulating layer 150 so as to be connected to the floating diffusion region 120 and the source/drain regions 121, 123, 125 and 127. Interconnection lines 143 connected to the contact plugs 141 may be formed on the interlayer insulating layers 150. The interconnection lines 143 may be disposed on the interlayer insulating layers 150 over the first surface 100a of the semiconductor substrate 100 regardless of positions. For example, the contact plugs 141 and the interconnection lines 143 may be formed of at least one of copper (Cu), aluminum (Al), tungsten (W), titanium (Ti), molybdenum (Mo), tantalum (Ta), titanium nitride (TiN), tantalum nitride (TaN), zirconium nitride (ZrN), tungsten nitride (WN), or an alloy of a combination thereof.

Figure 17:
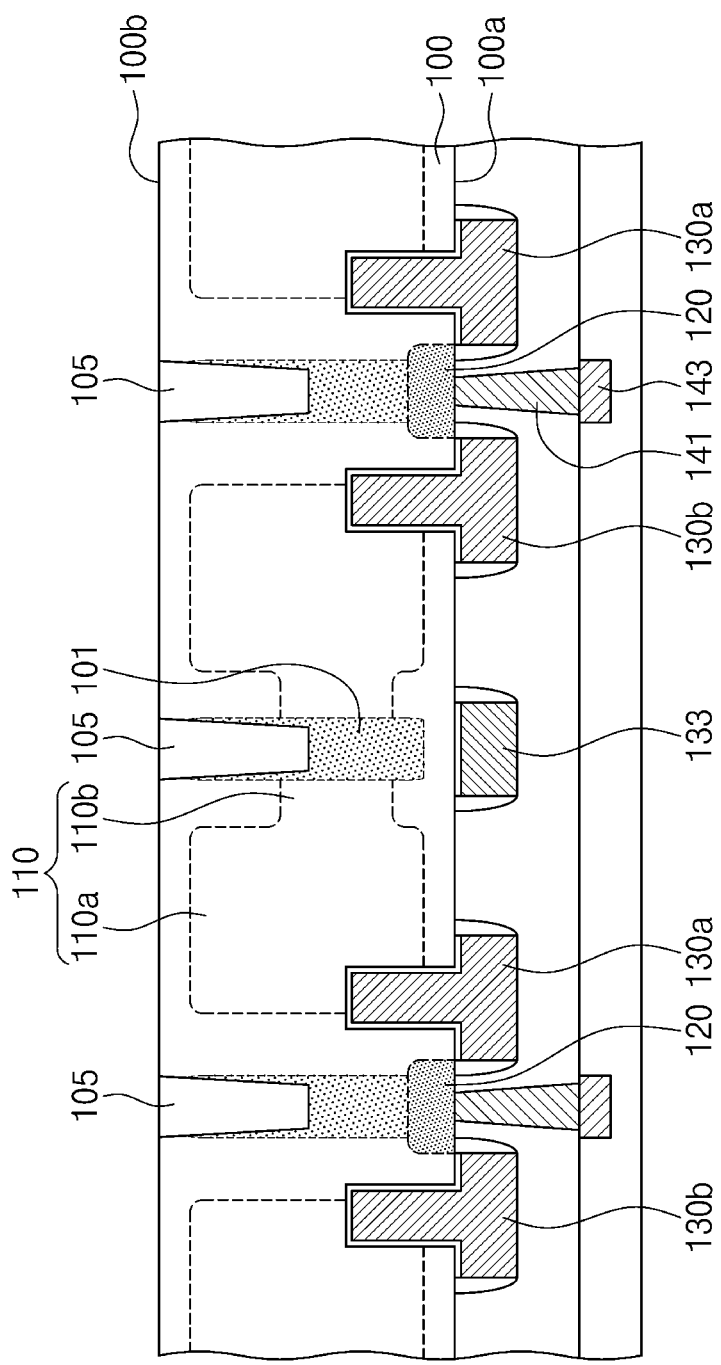

Referring to FIGS. 4 and 17, a support substrate (not shown) may be bonded to the uppermost one of the interlayer insulating layers 150, and then, a thinning process for removing a portion of the semiconductor substrate 100 may be performed to reduce a vertical thickness of the semiconductor substrate 100. The thinning process may include grinding or polishing the second surface 100b of the semiconductor substrate 100 and anisotropically or isotropically etching the second surface 100b of the semiconductor substrate 100. To thin the semiconductor substrate 100, the semiconductor substrate 100 may be turned over. A portion of the semiconductor substrate 100 may be removed by the grinding or polishing process, and then, the anisotropic or isotropic etching process may be performed to remove remaining surface defects of the semiconductor substrate 100.

Subsequently, the second surface 100b of the semiconductor substrate 100 may be patterned to form a deep trench defining pixel regions PR. In the present embodiments, a mask pattern (not shown) may be formed on the second surface 100b of the semiconductor substrate 100, and the semiconductor substrate 100 may be anisotropically etched using the mask pattern as an etch mask to form the deep trench. Since the semiconductor substrate 100 is anisotropically etched from the second surface 100b in the formation of the deep trench, a width of the deep trench may become progressively less from the second surface 100b toward the first surface 100a of the semiconductor substrate 100.

A pixel isolation layer 105 may be formed by filling the deep trench with a filling insulation layer. The pixel isolation layer 105 may include an air gap (not shown). In certain embodiments, the pixel isolation layer 105 may include a silicon oxide layer and a poly-silicon layer which are sequentially formed in the deep trench.

Subsequently, a fixed charge layer 210, a color filter layer 220 and micro lenses 230 such as shown in FIG. 5A for example may be formed on the pixel isolation layer 105 and the second surface 100b of the semiconductor substrate 100.

According to the embodiments of the inventive concepts, a portion of the photoelectric conversion layer may partially overlap with the readout circuit transistors, and thus an area in which photocharges are generated by incident light may be sufficiently secured even though a size of the image sensor is reduced. As a result, the full well capacity of the image sensor may be increased.

In addition, a portion of the transfer gate electrode may vertically penetrate a portion of the semiconductor substrate, and thus the charge transfer efficiency may be improved in operation of the image sensor even though an area of the photoelectric conversion layer is increased.

While the inventive concepts have been described with reference to example embodiments, it should be apparent to those skilled in the art that various changes and modifications may be made without departing from the spirit and scope of the inventive concepts. Therefore, it should be understood that the above embodiments are not limiting, but illustrative. Thus, the scope of the inventive concepts is to be determined by the broadest permissible interpretation of the following claims and their equivalents, and shall not be restricted or limited by the foregoing description.

What is claimed is:

1. An image sensor comprising:
   a semiconductor substrate having a front surface and a back surface opposite to the front surface; and
   a unit pixel comprising four sub-pixels sharing a charge detection node and a readout circuit,
   wherein each sub-pixel comprises:
   a transfer gate electrode including a lower portion disposed in a trench of the semiconductor substrate and an upper portion connected to the lower portion and protruding upward from the front surface; and
   a photoelectric conversion layer in the semiconductor substrate,
   wherein the photoelectric conversion layer includes a first part having a first thickness and a second part having a second thickness that is less than the first thickness, and
   wherein the second part is adjacent to the first part in a direction parallel to the front surface,
   wherein the first part vertically overlaps with the transfer gate electrode and the second part vertically overlaps with at least a portion of the readout circuit.

2. The image sensor of claim 1, wherein the transfer gate electrode forms a vertical channel from the photoelectric conversion layer to the charge detection node.

3. The image sensor of claim 2, wherein the semiconductor substrate includes first regions and second regions, and wherein the photoelectric conversion layers of the four sub-pixels are provided in each of the first regions, gate electrodes of the readout circuit are provided on the second regions, and the charge detection node is provided in a central portion of each of the first regions.

4. The image sensor of claim 3, wherein the first regions and the second regions are alternatively arranged in a first direction such that each of the second regions is disposed between adjacent ones of the first regions.

5. The image sensor of claim 4, further comprising a contact plug disposed on the charge detection node to connect the charge detection node to the readout circuit.

6. The image sensor of claim 5, wherein the readout circuit includes a source follow transistor.

7. The image sensor of claim 6, wherein the readout circuit further includes a selection transistor serially connected to the source follow transistor.

8. The image sensor of claim 1, wherein the transfer gate electrode has a non-rectangular shape when viewed in a plan view.

9. The image sensor of claim 1, further comprising a first isolation dopant layer including dopants in the semiconductor substrate under the charge detection node.

10. The image sensor of claim 9, further comprising a first pixel isolation layer disposed under the first isolation dopant layer.

11. The image sensor of claim 10, wherein the first pixel isolation layer extends from the back surface toward the front surface and includes an air gap and a silicon oxide.

12. The image sensor of claim 9, wherein the readout circuit includes a source follow transistor having a gate electrode formed on the front surface,
the image sensor further comprising a second isolation dopant layer under the gate electrode of the source follow transistor.

13. The image sensor of claim 12, further comprising a second pixel isolation layer disposed under the second isolation dopant layer.

14. The image sensor of claim 13, further comprising a well dopant layer between the gate electrode of the source follow transistor and the second isolation dopant layer.

15. The image sensor of claim 14, wherein the semiconductor substrate comprises first regions and second regions, and
the image sensor further comprises a device isolation layer disposed between the first and second regions and on the second part of the photoelectric conversion layer.

16. The image sensor of claim 9, wherein the charge detection node includes dopants of a first conductivity type in the semiconductor substrate, and
wherein the dopants of the first isolation dopant layer have a second conductivity type that is different than the first conductivity type.

17. The image sensor of claim 1, wherein the readout circuit includes a source follow transistor, and
wherein a gate electrode of the source follow transistor has a bottom surface located at a level lower than the front surface of the semiconductor substrate.

18. The image sensor of claim 1, further comprising:
a channel semiconductor pattern disposed on the front surface of the semiconductor substrate,
wherein the readout circuit includes a source follow transistor, and
wherein a gate electrode of the source follow transistor covers a sidewall and a top surface of the channel semiconductor pattern.

19. The image sensor of claim 1, wherein the photoelectric conversion layer further includes a third part having a third thickness that is less than the first thickness, and
wherein the third part vertically overlaps with at least a portion of the charge detection node.

20. An image sensor comprising:
a semiconductor substrate having a front surface and a back surface opposite to the front surface, the semiconductor substrate including first and second regions and a third region between the first and second regions; and
a unit pixel comprising four sub-pixels sharing a charge detection noted and a readout circuit,
wherein each sub-pixel comprises:
a transfer gate electrode including a lower portion disposed in a trench of the semiconductor substrate and an upper portion connected to the lower portion and protruding upward from the front surface; and
a photoelectric conversion layer in the semiconductor substrate,
wherein the photoelectric conversion layer includes a first part having a first thickness and a second part having a second thickness that is less than the first thickness, and
wherein the first part of the photoelectric conversion layer vertically overlaps with the transfer gate electrode and the second part the photoelectric conversion layer vertically overlaps with at least a portion of the readout circuits,
wherein the readout circuit comprises transistors provided on the first and second parts, and
wherein the photoelectric conversion layers of the four sub-pixels are provided in the third region.

* * * * *